United States Patent
Fouquet et al.

(10) Patent No.: US 7,852,186 B2
(45) Date of Patent: Dec. 14, 2010

(54) COIL TRANSDUCER WITH REDUCED ARCING AND IMPROVED HIGH VOLTAGE BREAKDOWN PERFORMANCE CHARACTERISTICS

(75) Inventors: Julie E. Fouquet, Portola Valley, CA (US); Gary R. Trott, San Mateo, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/059,747

(22) Filed: Mar. 31, 2008

(65) Prior Publication Data

US 2008/0180206 A1  Jul. 31, 2008

Related U.S. Application Data

(63) Continuation-in-part of application No. 11/747,092, filed on May 10, 2007, now abandoned, and a continuation-in-part of application No. 11/512,034, filed on Aug. 28, 2006.

(51) Int. Cl.
| | |
|---|---|
| H01F 5/00 | (2006.01) |
| H01F 27/29 | (2006.01) |
| H01F 27/28 | (2006.01) |
| H01F 27/04 | (2006.01) |

(52) U.S. Cl. ................ 336/200; 336/192; 336/223; 336/232; 336/107

(58) Field of Classification Search ............ None
See application file for complete search history.

(56) References Cited

U.S. PATENT DOCUMENTS

| | | | |
|---|---|---|---|
| 4,027,152 A | 5/1977 | Brown et al. | |
| 4,494,100 A * | 1/1985 | Stengel et al. | ............... 336/200 |
| 4,541,894 A | 9/1985 | Cassat | |
| 5,070,317 A | 12/1991 | Bhagat | |
| 5,312,674 A * | 5/1994 | Haertling et al. | ............ 428/210 |
| 5,363,081 A * | 11/1994 | Bando et al. | ................ 336/200 |
| 5,420,558 A | 5/1995 | Ito et al. | |
| 5,597,979 A | 1/1997 | Courtney et al. | |
| 5,693,871 A | 12/1997 | Stout et al. | |
| 5,716,713 A * | 2/1998 | Zsamboky et al. | .......... 428/457 |
| 5,754,088 A | 5/1998 | Fletcher et al. | |

(Continued)

FOREIGN PATENT DOCUMENTS

CN    1180277    6/1996

(Continued)

OTHER PUBLICATIONS

ACCL-9xxx 3.3V/5V High Speed CMOS Capacitive Isolator, Preliminary Datasheet, Avago Technologies, Date unknown.

(Continued)

*Primary Examiner*—Elvin G Enad
*Assistant Examiner*—Mangtin Lian

(57) ABSTRACT

Disclosed herein are various embodiments of coil transducers and galvanic isolators configured to provide high voltage isolation and high voltage breakdown performance characteristics in small packages. A coil transducer is provided across which data or power signals may be transmitted and received by primary and secondary coils disposed on opposing sides thereof without high voltage breakdowns occurring therebetween. At least portions of the coil transducer are formed of an electrically insulating, non-metallic, non-semiconductor, low dielectric loss material. The coil transducer may be formed in a small package using, by way of example, printed circuit board, CMOS-compatible and other fabrication and packaging processes.

31 Claims, 5 Drawing Sheets

U.S. PATENT DOCUMENTS

| | | | |
|---|---|---|---|
| 5,825,259 | A | 10/1998 | Harpham |
| 5,952,849 | A | 9/1999 | Haigh |
| 6,167,475 | A | 12/2000 | Carr |
| 6,175,293 | B1 | 1/2001 | Hasegawa et al. |
| 6,215,377 | B1 | 4/2001 | Douriet et al. |
| 6,255,714 | B1* | 7/2001 | Kossives et al. ............. 257/528 |
| 6,307,457 | B1* | 10/2001 | Wissink et al. ............. 336/200 |
| 6,320,532 | B1 | 11/2001 | Diede |
| 6,404,317 | B1 | 6/2002 | Mizoguchi et al. |
| 6,489,850 | B2 | 12/2002 | Heineke et al. |
| 6,501,364 | B1 | 12/2002 | Hui et al. |
| 6,525,566 | B2 | 2/2003 | Haigh et al. |
| 6,538,313 | B1* | 3/2003 | Smith ........................ 257/684 |
| 6,574,091 | B2 | 6/2003 | Heineke et al. |
| 6,661,079 | B1 | 12/2003 | Bikulcius et al. |
| 6,856,226 | B2 | 2/2005 | Gardner |
| 6,867,678 | B2 | 3/2005 | Yang |
| 6,870,456 | B2 | 3/2005 | Gardner |
| 6,873,065 | B2 | 3/2005 | Haigh et al. |
| 6,888,438 | B2 | 5/2005 | Hui et al. |
| 6,891,461 | B2 | 5/2005 | Gardner |
| 6,903,578 | B2 | 6/2005 | Haigh et al. |
| 6,922,080 | B2 | 7/2005 | Haigh et al. |
| 6,943,658 | B2 | 9/2005 | Gardner |
| 6,944,009 | B2 | 9/2005 | Nguyen et al. |
| 7,064,442 | B1 | 6/2006 | Lane et al. |
| 7,170,807 | B2 | 1/2007 | Fazan et al. |
| 7,171,739 | B2* | 2/2007 | Yang et al. ................. 29/602.1 |
| 7,425,787 | B2* | 9/2008 | Larson, III .................. 310/311 |
| 7,436,282 | B2* | 10/2008 | Whittaker et al. ........... 336/200 |
| 7,460,604 | B2 | 12/2008 | Dupuis |
| 2002/0110013 | A1 | 8/2002 | Park et al. |
| 2004/0056749 | A1 | 3/2004 | Kahlmann et al. |
| 2005/0003199 | A1 | 1/2005 | Takaya et al. |
| 2005/0057277 | A1 | 3/2005 | Chen et al. |
| 2005/0077993 | A1* | 4/2005 | Kanno et al. ................ 336/223 |
| 2005/0133249 | A1 | 6/2005 | Fujii |
| 2005/0269657 | A1 | 12/2005 | Dupuis |
| 2005/0272378 | A1 | 12/2005 | Dupuis |
| 2006/0028313 | A1* | 2/2006 | Strzalkowski et al. ....... 336/223 |
| 2006/0152322 | A1* | 7/2006 | Whittaker et al. ........... 336/200 |
| 2006/0170527 | A1* | 8/2006 | Braunisch ................... 336/223 |
| 2006/0176137 | A1* | 8/2006 | Sato et al. ................... 336/200 |
| 2006/0220775 | A1* | 10/2006 | Ishikawa .................... 336/200 |
| 2007/0085447 | A1 | 4/2007 | Larson, III |
| 2007/0085632 | A1 | 4/2007 | Larson, III et al. |
| 2007/0086274 | A1 | 4/2007 | Nishimura et al. |
| 2007/0133933 | A1 | 6/2007 | Yoon et al. |
| 2007/0281394 | A1* | 12/2007 | Kawabe et al. .............. 438/118 |
| 2007/0290784 | A1 | 12/2007 | Nesse et al. |
| 2008/0007382 | A1* | 1/2008 | Snyder ....................... 336/200 |
| 2008/0031286 | A1 | 2/2008 | Alfano et al. |
| 2008/0051158 | A1 | 2/2008 | Male et al. |
| 2008/0174396 | A1* | 7/2008 | Choi et al. .................. 336/182 |
| 2008/0176362 | A1 | 7/2008 | Sengupta et al. |
| 2008/0198904 | A1 | 8/2008 | Chang |
| 2008/0278275 | A1 | 11/2008 | Fouquet |
| 2008/0308817 | A1 | 12/2008 | Wang et al. |
| 2008/0311862 | A1 | 12/2008 | Spina |
| 2009/0072819 | A1 | 3/2009 | Takahashi |
| 2010/0020448 | A1 | 1/2010 | Ng et al. |
| 2010/0052120 | A1 | 3/2010 | Pruitt |

FOREIGN PATENT DOCUMENTS

| | | |
|---|---|---|
| CN | 1237081 | 12/1999 |
| DE | 19911133 | 10/2000 |
| DE | 10154906 | 5/2003 |
| EP | 1309033 | 5/2003 |
| EP | 1617337 | 1/2006 |
| GB | 2403072 | 6/2004 |
| JP | 57-39598 | 3/1982 |
| JP | 61-59714 | 3/1986 |
| JP | 3171705 | 7/1991 |
| JP | 06-53052 | 2/1994 |
| JP | 2000-508116 | 6/2000 |
| JP | 2003-151829 | 5/2003 |
| JP | 2005-513824 | 5/2005 |
| WO | WO-9734349 | 3/1997 |
| WO | WO 20051001928 | 6/2005 |

OTHER PUBLICATIONS

Texas Instruments Dual Digital Isolators, SLLS755E, Jul. 2007.
"Off the Shelf SMT Planar Transformers," Payton Group International, Date Unknown.
IEEE Abstract for "Meaasurements of Permittivity, Loss Dielectric Tangent, and Resistivity of Float-Zone Silicon at Microwave Frequencies," Krupka et al., Microwave Theory and Techniques, IEE Transactiond, Nove., 2008, vol. 54, issue 11, pp. 3995-4001.
"Planar Transformers Make Maximum Use of Precious Board Space," Electronic Design, Mar. 9, 1998, ED Online ID #7647.
Analog Devices iCoupler Digital Isolator ADuM1100 Data Sheet, Rev. F. 2006.
U.S. Appl. No. 11/264,956, filed Nov. 1, 2005, Guenin et al.
U.S. Appl. No. 11/512,034, filed Aug. 28, 2006, Fouquet et al.
U.S. Appl. No. 11/747,092, filed May 10, 2007, Fouquet et al.
"iCoupler Products with Iso Power Technology: Signal and Power Transfer Across Isolation Barrier Using Microtransformers" to Chen; 2006, Abnalog Devices.
"Loss Characteristics of Silicon Substrate with Different Resistivities" to Yang et al., Microwave and Optical Technology Letters, vol. 48, No. 9, Sep. 2006.
"Advanced Circuit Materials, High Frequency Laminates and Flexible Circuit Materials," Rogers Corp., www.rogerscorporation.com/mwu/translations/prod.htm, website addresses accessed Mar. 24, 2008.
"Advanced Circuit Materials, High Frequency Laminates and Flexible Circuit Materials", *Rogers Corporation*, www.rogerscorporation.com/mwu/translations/prod.htm Mar. 2008.
"Allfex Flexible Printed Circuits", *Design Guide*.
Myers, John et al., "GMR Isolators", *Nonvalatile Electronics, Inc.* 1998.
Oljaca, Miroslav , "Interfacing the ADS1202 Modulator with a Pulse Transformer In Galvanically Isolated Systems", *SBAA096* Jun. 2003, 22 pages.
Analog Devices, , "iCoupler R Digital Isolation Products", 2005.
Chen, Baoxing et al., "High Speed Digital Isolators Using Microscale On-Chip Transformers", Jul. 22, 2003.
Kliger, R. , "Integrated Transformer-Coupled Isolation", Mar. 2003.
Smith, Carl H. et al., "Chip-Size Magnetic Sensor Arrays", May 21, 2002.

* cited by examiner

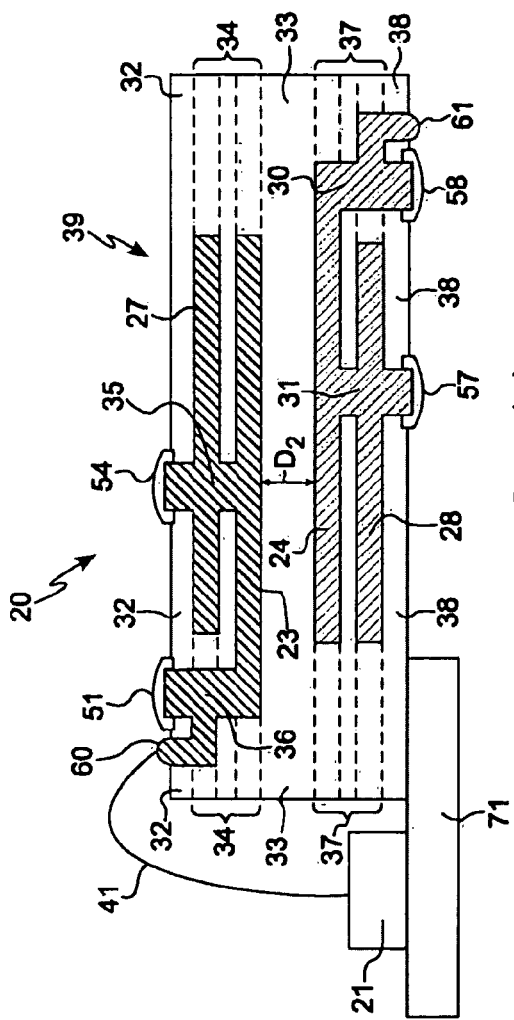
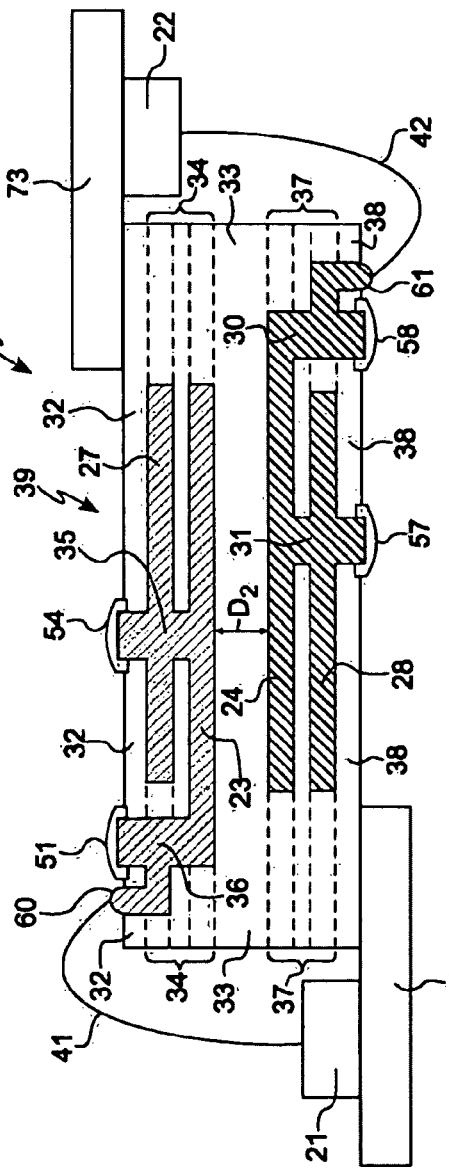
FIG. 7(a)
FIG. 7(b)

COIL TRANSDUCER WITH REDUCED ARCING AND IMPROVED HIGH VOLTAGE BREAKDOWN PERFORMANCE CHARACTERISTICS

RELATED APPLICATIONS

This application claims priority and other benefits from, and is a continuation-in-part of, U.S. patent application Ser. No. 11/512,034 filed Aug. 28, 2006 entitled "Improved Galvanic Isolator" to Fouquet et al., and U.S. patent application Ser. No. 11/747,092 filed May 10, 2007 entitled "Miniature Transformers Adapted for Use in Galvanic Isolators and the Like" to Fouquet et al. This application also hereby incorporates by reference, in its entirety, U.S. patent application Ser. No. 12/059,979 filed on even date herewith entitled "Galvanic Isolators and Coil Transducers" to Fouquet et al.

FIELD OF THE INVENTION

Various embodiments of the invention described herein relate to the field of data signal and power transformers or galvanic isolators, and more specifically to devices employing inductively coupled magnetic data signal and power transformers.

BACKGROUND

High voltage isolation data signal and power transfer devices (or galvanic isolators) known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required.

Prior art magnetic galvanic isolators often achieve voltage isolation by employing opposing inductively-coupled coils, typically require the use of at least three separate integrated circuits or chips, and are often susceptible to electromagnetic interference ("EMI") and other forms of undesired electrical noise such as transients.

Prior art capacitive galvanic isolators typically achieve high voltage isolation by employing multiple pairs of transmitting and receiving electrodes, where for example a first pair of electrodes is employed to transmit and receive data, and a second pair of electrodes is employed to refresh or maintain the transmitted signals. Such capacitive devices typically exhibit poor high voltage hold-off or breakdown characteristics.

In prior art capacitive and magnetic galvanic isolators, internal and external high voltage breakdowns can occur when disparate voltages on opposing input and output sides of a galvanic isolator cause arcing. Achieving high levels of voltage isolation may require the use of ever more unique and expensive manufacturing and processing methods, which can result in the cost of a product being pushed beyond the boundaries of commercial practicability.

What is needed is a galvanic isolator or isolator package that exhibits improved high voltage internal and external breakdown performance characteristics, is small, consumes reduced power, permits data to be communicated at relatively high data rates, may be built at lower cost, or that has other advantages that will become apparent after having read and understood the specification and drawings hereof.

SUMMARY

In one embodiment, there is provided a coil transducer comprising a generally planar electrically insulating substrate comprising opposing upper and lower surfaces, the substrate forming a dielectric barrier and comprising an electrically insulating, non-metallic, non-semiconductor, low dielectric loss material, a first electrically conductive coil formed in at least a first metalized layer disposed within, upon or near the substrate, and a second electrically conductive coil formed in at least a third metalized layer disposed within, upon or near the substrate, where the first and second coils are spatially arranged and configured respecting one another such that at least one of power and data signals may be transmitted by the first coil to the second coil across the substrate, the first coil is separated from the second coil by a vertical distance exceeding about 1 mil, and a breakdown voltage between the first coil and the second coil exceeds about 2,000 volts RMS.

In another embodiment, there is provided a coil transducer comprising a generally planar electrically insulating substrate comprising opposing upper and lower surfaces, the substrate forming a dielectric barrier and comprising an electrically insulating, non-metallic, non-semiconductor low-dielectric-loss material having a dielectric loss tangent at room temperature that is less than or equal to 0.05, a first electrically conductive coil formed in at least a first metalized layer disposed within, on or near the substrate, and a second electrically conductive coil formed in at least a third metalized layer disposed within, on or near the substrate, where the first and second coils are spatially arranged and configured respecting one another such that at least one of power and data signals may be transmitted by the first coil to the second coil across the substrate, the first metalized layer is separated from the third metalized layer by a vertical distance exceeding about 1 mil, and a breakdown voltage between the first coil and the second coil exceeds about 2,000 volts RMS.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

FIGS. 7(a) and 7(b) illustrate yet another embodiment of galvanic isolator 20 and coil transducer 39 of the invention.

The drawings are not necessarily to scale. Like numbers refer to like parts or steps throughout the drawings, unless otherwise noted.

DETAILED DESCRIPTIONS OF SOME PREFERRED EMBODIMENTS

Figure 1:
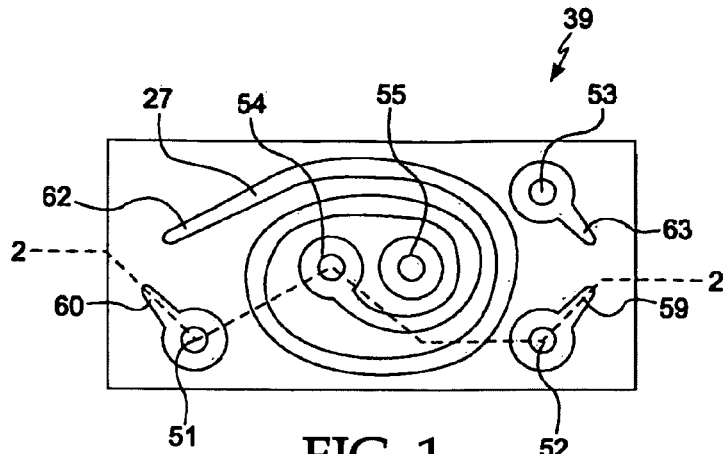
FIGS. 1 and 2 illustrate coil transducer 39 according to one embodiment of the invention.

In the following description, specific details are provided to impart a thorough understanding of the various embodiments of the invention. Upon having read and understood the specification, claims and drawings hereof, however, those skilled in the art will understand that some embodiments of the invention may be practiced without hewing to some of the specific details set forth herein.

In the drawings, some, but not all, possible embodiments of the invention are illustrated, and further may not be shown to scale.

The term "horizontal" as used herein is defined as a plane substantially parallel to the conventional plane or surface of the substrate of the invention, regardless of its actual orientation in space. The term "vertical refers to a direction substantially perpendicular to the horizontal as defined above. Terms such as "on,", "above," "below," "bottom," "top," "side," "sidewall," "higher," "lower," "upper," "over" and "under" are defined in respect of the horizontal plane discussed above.

Figure 2:
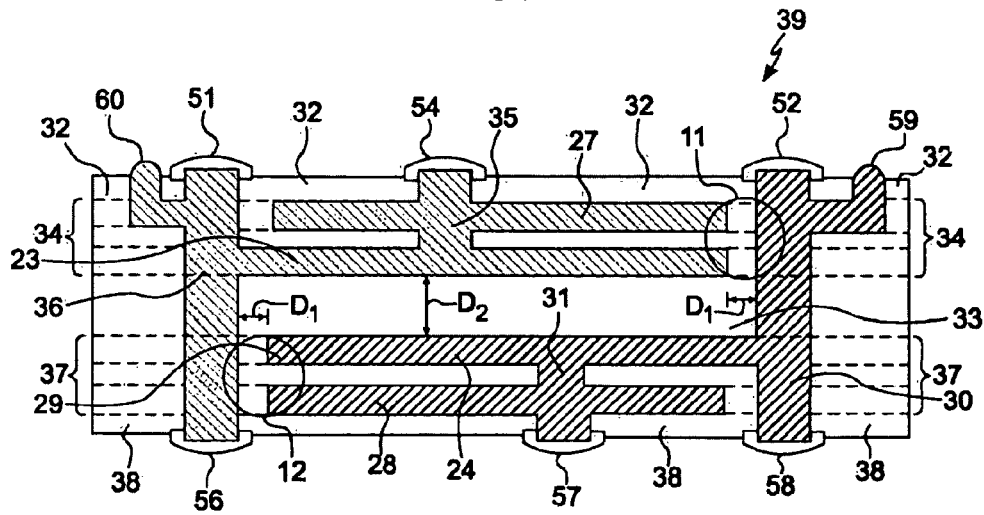

Referring to FIGS. 1 and 2, there is shown one embodiment of coil transducer 39 of the invention. FIG. 1 shows a top plan view of coil transducer 39, and FIG. 2 shows a cross-sectional view of coil transducer 39 along line 2-2 of FIG. 1. Coil transducer 39 is configured to send data and/or power signals from a transmitter circuit 21 to a receiver circuit 22 (not shown in FIGS. 1 and 2) across a dielectric barrier. In one embodiment, such a dielectric barrier comprises substrate 33, which is disposed between an input or first transmitting coil 23 and an output or second receiving coil 24. Coil transducer 39 and substrate 33 disposed therewithin may comprise any of a number of different non-metallic, non-semiconductor, low dielectric loss materials and/or layers, more about which is said below.

In a preferred embodiment, coil transducer 39 and substrate 33 are capable of withstanding several kilovolts of potential difference between the input and output sides of coil transducer 39, and thus exhibit high voltage breakdown performance characteristics. In a preferred embodiment, substrate 33 and coil transducer 39 have sufficient thicknesses between upper and lower horizontal surfaces thereof, and electrical insulation characteristics appropriate, to withstand the relatively high breakdown voltages.

By way of example, in one embodiment a breakdown voltage between coil 23 and coil 24 exceeds about 2,000 volts RMS when applied over a time period of about one minute. In other embodiments, the breakdown voltage between coil 23 and coil 24 exceeds about 2,000 volts RMS when applied over six minutes or over 24 hours.

In other embodiments, even higher breakdown voltages can be withstood by coil transducer 39, substrate 33 and galvanic isolator 20, such as about 2,500 volts RMS, about 3,000 volts RMS, about 4,000 volts RMS and about 5,000 volts RMS for periods of time of about 1 minute, 6 minutes and/or 24 hour, or over the design lifetime of the device.

These performance characteristics are highly desirable, as the various conductors and coils disposed in coil transducer 39 often exhibit voltages or potentials that are significantly different from one another. The various embodiments of the invention described and shown herein are thus configured to withstand high breakdown voltages, and may also be configured to transfer signals and power more efficiently than optical isolators of the prior art finding current widespread use.

Substrate 33 and/or coil transducer 39 are formed of one or more appropriate electrically insulating, non-metallic, non-semiconductor, low dielectric loss materials. In one embodiment, a suitable material has a dielectric loss tangent at room temperature that is less than about 0.05, less than about 0.01, less than about 0.001 or less than about 0.0001. Further information regarding dielectric loss tangents and the intrinsic and extrinsic losses associated therewith is set forth in "Loss Characteristics of Silicon Substrate with Different Resistivities" to Yang et al., pp. 1773-76, vol. 48, No. 9, September 2006, Microwave and Optical Technology Letters. Yang et al. discuss theoretically and experimentally dividing dielectric losses into an intrinsic loss tangent of silicon and an extrinsic loss associated with substrate leakage losses, and demonstrate that as doping levels in silicon increase, extrinsic losses also increase.

Some examples of suitable materials for forming substrate 33 and/or various layers included in coil transducer 39 also include, but are not limited to, one or more of printed circuit board material, FR4 and other printed circuit board materials, fiberglass, glass, ceramic, polyimide, polyimide film, a polymer, an organic material, a combination of an organic filler such as epoxy and an inorganic solid such as glass, a flex circuit material, epoxy, epoxy resin, a printed circuit board material, plastic, DUPONT™ KAPTON™, DUPONT™ PYRALUX AB™ laminate, and a ROGERS™ material (e.g., PTFE—or polytetrafluoroethylene—and glass, PTFE and ceramic, PTFE, glass and ceramic, or thermoset plastic). The particular choice of the material from which substrate 33 is formed will, in general, depend on cost, the degree or amount of electrical isolation or voltage breakdown protection that is desired, the particular application at hand, and other factors or considerations. For example, glass and ceramic substrates are well suited for applications involving high voltages; to reduce manufacturing and processing costs, flex circuit substrates may be employed.

In some embodiments, substrate 33 and/or coil transducer 39 has a thickness between the upper and lower horizontal surfaces thereof ranging between about 0.5 mils and about 25 mils. In one embodiment, the thickness of substrate 33 and/or coil transducer 39 exceeds about 1.5 mils. In another embodiment, substrate 33 and/or coil transducer 39 comprises a plurality of layers, where at least one of the layers comprises a low dielectric loss material.

In one embodiment, the structures illustrated in FIGS. 1 and 2 may be fabricated using a conventional printed circuit board fabrication line. As a result, the cost of manufacturing coil transducer 39 may be much less than that of a coil transducer constructed from silicon on a semiconductor fabrication line. Embodiments of coil transducer 39 based on flexible organic/inorganic or organic substrates are particularly attractive. Printed circuit boards or circuit carriers are known in the art, and hence need not be discussed in detail here. It is worth noting, however, that substrates 33 and coil transducers 39 of the invention that are formed from printed circuit board materials do provide an excellent low-cost alternative to silicon-based fabrication methods and materials. Printed circuit board materials are less expensive, easier to handle, and more amenable to quick design or manufacturing changes than silicon-based materials. For purposes of the present discussion it is sufficient to note that printed circuit boards may be fabricated by depositing a thin metal layer, or attaching a thin metal layer, on a somewhat flexible organic/inorganic substrate formed of fiberglass impregnated with epoxy resin and then converting the layer into a plurality of individual conductors using conventional photolithographic techniques. Additional metal layers may be added atop the thin metal layer after an intervening electrically insulating layer or coating has been laid down on the thin metal layer.

Flex circuit technology may also be employed to form substrate 33 and/or coil transducer 39 of galvanic isolator 20, where substrate 33 and/or coil transducer 39 are made of an organic material such as polyimide. Films and laminates of this type are available commercially from DUPONT™ and utilize substrate materials known as KAPTON™ made from polyimide. In some cases, a plurality of polyimide layers may be laminated with an adhesive to form substrate 33 and/or coil transducer 39. This type of circuit carrier or printed circuit board is significantly less expensive than conventional silicon semiconductor material based approaches and can be employed to provide substrate 33 and/or coil transducer 39 having a high breakdown voltage and other desirable high voltage isolation characteristics. Thinner substrates 33 and/or coil transducers 39 are preferred in applications where signal losses between primary and secondary coils 23 and 24 must be minimized. For example, in one embodiment of substrate 33 and/or coil transducer 39, a PYRALUX AP™ laminate manufactured by DUPONT™ is employed to form a 2 mil thick KAPTON™ substrate 33, and electrically conductive copper layers and traces are added to the top and bottom surfaces thereof.

Note that coils 23 and 24 may assume any of a number of different structural configurations and nevertheless fall within the scope of the invention. For example, coils 23 and 24 may assume the circular or oval spirally-wound shapes illustrated in FIGS. 1 and 2, or may assume myriad other shapes such as rectangularly, squarely, triangularly, pentagonally, hexagonally, heptagonally or octagonally-wound shapes arranged in a horizontal plane, conductors arranged to interleave with one another within a horizontal plane, one or more serpentine conductors arranged in a horizontal plane, and so on. Any suitable structural configuration of coils 23 and 24 is permitted so long as the magnetic fields projected by one coil may be received and sufficiently well detected by the other opposing coil.

As described above, substrate 33 and/or coil transducer 39 are preferably fabricated to have a thickness between their respective upper and lower surfaces sufficient to prevent high voltage arcing. One advantage of the materials employed to form substrate 33 and/or coil transducer 39 of the invention is that substrate 33 and/or coil transducer 39 may be substantially thicker than is generally possible or financially feasible in commercial applications which employ conventional semiconductor materials and manufacturing processes. For example, substrate 33 and/or coil transducer 39 may have thicknesses ranging between about 1 mil and about 25 mils, between about 1.5 mils and about 25 mils, or between about 2 mils and about 25 mils. Polyimide processes compatible with silicon IC processes are typically much thinner and cannot withstand voltages nearly as high as those capable of being withstood by some embodiments of substrate 33 and/or coil transducer 39. The high distance-through-insulation (DTI) values characteristic of some embodiments of substrate 33 and coil transducer 39 provide a desirable performance metric in many electrical isolator applications and easily meet most certification requirements issued by relevant standards organizations. Conversely, substrate 33 and/or coil transducer 39 may also be made quite thin, e.g., 0.5 mils or less, and yet still provide relatively high voltage breakdown performance characteristics.

Note further that substrate 33 and/or coil transducer 39 of the invention may be formed using any of a number of different manufacturing processes and electrically insulating, non-metallic, non-semiconductor, low dielectric loss materials described above. These processes and materials are amenable to processing bulk electrically insulating materials and do not require the expensive and elaborate procedures required to handle semiconductor materials such as silicon. Moreover, substrate 33 and coil transducer 39 of the invention provide superior high voltage breakdown performance characteristics respecting silicon-based devices owing to their increased distances-through-insulation (more about which is said above). Because substrate 33 and coil transducer 39 of the invention exhibit substantially increased distances-though-insulation and thicknesses respecting prior art galvanic isolators having silicon substrates (which were generally limited to distances-through-insulation thicknesses of less than 1 mil), substrate 33 may be configured to impart substantial mechanical rigidity and strength to coil transducer 39 and galvanic isolator 20 such that coil transducer 39 may be handled during normal manufacturing processes without the conductors disposed on, in or near substrate 33 breaking or fracturing. Unlike the relatively fragile and thin silicon substrates of the prior art, substrate 33 and coil transducer 39 of the invention are mechanically robust and strong, may be mounted directly on lead frames, and may be handled without special care.

In addition, although in theory it might be possible to manufacture a substrate or coil transducer from semiconductor-based materials upon opposing surfaces upon which conductors could be formed using metalized layers, such constructions are rarely (if at all) seen in practice owing to the general delicacy of semiconductor-based materials. As a result, substrates or coil transducers formed from semiconductor materials are typically handled in a manner that requires metalized or other layers be formed on one side only of such substrates. Contrariwise, in substrate 33 and/or coil transducer 39 of the invention, both sides of substrate 33 and/or coil transducer 39 may easily have coils or other components formed or mounted thereon owing to the radically different nature of the manufacturing processes used, and the materials employed, to form substrate 33 and/or coil transducer 39.

Continuing to refer to FIGS. 1 and 2, substrate 33 separates coils 23 and 24, and forms a portion of coil transducer 39, which comprises electrically insulating layers 32, 34, 37 and 38. In one embodiment, layers 34 and 37 are formed of an electrically insulating, non-metallic, non-semiconductor, low dielectric loss material described in greater detail below, while layers 32 and 38 are formed of an electrically insulating coating or coverlay material, more about which is also said below. Other embodiments of layers 32, 34, 37 and 38 are also possible.

As shown in FIGS. 1 and 2, coil transducer 39 comprises first coil 23 and second coil 24. First and second coils 23 and 24 are separated from one another by an electrically insulating, non-metallic, non-semiconductor, low dielectric loss material forming substrate 33 disposed therebetween, which is a dielectric barrier. Upper and lower surfaces of substrate 33, and layers 32, 34, 37 and 38 are delineated in the Figures by dashed lines. The same or similar material employed to form substrate 33 may be used to form dielectric or electrically insulating layers 34 and 37 disposed above and below substrate 33, and in which electrical conductors 23, 27, 24 and 28 may be embedded or otherwise formed. Alternatively, other suitable materials may be employed to form such layers. In one embodiment, such electrical conductors are spirally or ovally shaped, although many other configurations and shapes for such conductors may be employed. As those skilled in the art will understand, coils 23 and 24 may be placed on, in or near substrate 33, or on, in, near or under layers 34 or 37. Many other variations and embodiments are also possible.

In addition to providing excellent high voltage breakdown performance characteristics, substrate 33 and coil transducer 39 can also be configured to impart substantial structural rigidity and strength to galvanic isolator 20, and thereby eliminate the need to include an independent structural member that is separate and apart from a coil transducer, and that is required to impart structural rigidity and strength thereto, such as has been practiced in the prior art by way of, for example, providing a thick (e.g., 25-100 mils) silicon substrate beneath a coil transducer or galvanic isolator.

The outer otherwise exposed metalized layers of coil transducer 39 are preferably protected by an electrically insulating or dielectric coating or coverlay layers 32 and 38. In preferred embodiments, coating or coverlay layers 32 and 38 are relatively thin and conform to the pattern of etched metal spiral conductors 27 and 28 disposed therebeneath. Coating or coverlay layers 32 and 38 should have few or no empty regions or voids disposed therebeneath or therein so as to prevent high voltage breakdown thereacross owing to the reduced ability of the empty region or void to withstand high voltages compared to, for example, polyimide. To prevent the formation of voids in such a coating or coverlay material, a vacuum may be drawn while laminating the different layers of coil transducer 39 together, or by degassing liquid photo-imageable coverlay materials before they are applied. Since an electrically insulating, non-metallic, non-semiconductor, low dielectric loss material such as polyimide disposed beneath the coating or coverlay material may be relatively thin, the ability to withstand high voltages may not be as good through coating or coverlay layers 32 and 38 as through substrate 33 (regardless of whether or not voids are present in or adjacent to coating or coverlay layers 32 and 38).

In the embodiment illustrated in FIGS. 1 and 2, first coil 23 comprises a first spiral electrical conductor 23 and a second spiral electrical conductor 27. Second spiral conductor 27 is located above first spiral conductor 23 and is disposed in a second metalized layer, while first spiral conductor 23 is located below second spiral conductor 27 and is disposed in a first metalized layer. First and second spiral conductors 23 and 27 are electrically connected to one another by vertical metal via 35, which electrically interconnects the first and second metalized layers and first and second spiral conductors 23 and 27 disposed therein. The first and second metalized layers, and first and second spiral conductors 23 and 27, are configured and positioned respecting one another such that electrical current rotates in the same direction through first and second spiral conductors 23 and 27. Maintaining the same sense of rotation causes the magnetic fields generated by first and second spiral conductors 23 and 27 to add constructively to one another instead of cancelling one another.

Referring now to FIG. 2, second coil 24 comprises third spiral electrical conductor 24 and fourth spiral electrical conductor 28. Third spiral conductor 24 is located above fourth spiral conductor 28 and is disposed in a third metalized layer, while fourth spiral conductor 28 is located below third spiral conductor 24 and is disposed in a fourth metalized layer. Third and fourth spiral conductors 24 and 28 are electrically connected to one another by vertical metal via 31, which electrically interconnects the third and fourth metalized layers and spiral conductors 24 and 28 disposed therein. The third and fourth metalized layers, and third and fourth spiral conductors 24 and 28, are configured and positioned respecting one another such that electrical current rotates in the same direction through third and fourth spiral conductors 24 and 28. Maintaining the same sense of rotation causes the magnetic fields generated by third and fourth spiral conductors 24 and 28 to add constructively to one another instead of cancelling one another.

Continuing to refer to FIG. 2, regions 11 and 12 in coil transducer 39 represent those portions of coil transducer 39 where internal high voltage breakdown may be most likely to occur. This is due to distance $D_1$ between spiral conductors 24 and 28 (which are held at a first voltage) and vertical metal via 36 (which is held a second voltage different from the first voltage) being relatively small. Furthermore, voids or adhesives which may be present in this region do not withstand as high voltages per unit distance as solid insulators such as KAPTON.™ By way of example, in some embodiments of the invention distance $D_1$ may range between about 2 mils and about 10 mils. In contrast, internal high voltage breakdown is less likely to occur between first spiral conductor 23 and third spiral conductor 24, where distance $D_2$ between first spiral conductor 23 (which is held at a first voltage) and third spiral conductor 24 (which is held at a second voltage different from the first voltage) can be relatively large. Note further that the gaps shown in FIG. 2 between vertical vias 30 and 36 on the one hand, and conductors 27, 23, 24 and 28 on the other hand, need not be all be restricted to the same distance $D_1$, and indeed may assume any of a number different suitable values. Moreover, in preferred embodiments of the invention, distance $D_1$ is greater than or equal to distance $D_2$, since high voltage breakdowns may occur at horizontally opposed internal interfaces more easily than through vertically opposed internal interfaces (where bulk material must generally be traversed to effect a voltage breakdown) owing to the lower critical electric field potentials typically associated with horizontally opposed interfaces, voids or adhesives.

As shown in FIG. 2, in one embodiment distance $D_2$ corresponds to the distance or separation between the lower surface of first spiral conductor 23 and the upper surface of third spiral conductor 24, and also corresponds to a distance extending vertically across substrate 33 forming the dielectric barrier and comprising the special non-metallic, non-semiconductor, low dielectric loss materials discussed above. That is, in the embodiment shown in FIG. 2, distance $D_2$ corresponds to the thickness of substrate 33 and in some preferred embodiments exceeds about 0.5 mils, about 1 mil, about 2 mils, about 3, mils, about 4 mils, about 5 mils, about 6 mils, about 7 mils, about 8 mils, about 9 mils and about 10 mils.

Electrical connections must be established between coil transducer 39 and devices external thereto, such as transmitter circuit 21 and receiver circuit 22 (not shown in FIGS. 1 and 2). In one configuration, and as shown in FIG. 1, wirebond pads 59, 60, 62 and 63 are located on the top surface of coil transducer 39. In such a configuration, access to the third and fourth metalized layers must somehow be provided from the top surface of coil transducer 39, such as by disposing conductive via 30 between such layers and wirebond contact 59. Wirebond pads 59, 60, 62 and 63 are preferably electroplated to facilitate the establishment of electrical connections. Holes can be formed in the top coating or coverlay material to permit access to wirebond pads 59, 60, 62 and 63. Alternatively, by way of example, two via holes can be formed that extend from locations 52 and 53 disposed atop coil transducer 39 down to the third and fourth metalized layers, respectively (and which contain third and fourth spiral conductors 24 and 28). Conductive via 31 can be configured to route a signal between the fourth metalized layer and the third metalized layer, and wirebond pads 59 and 63 can be electroplated to permit the third and fourth metalized layers to be accessed electrically therethrough. The embodiment illustrated in FIGS. 1 and 2 offers the convenience of easy topside wirebonding access to each of the first, second, third and fourth metalized layers. It will be appreciated, however, that full through vias 30 and 36 (as well as the via disposed beneath location 53) consume a relatively large amount of "real estate" in coil transducer 39, and consequently result in the size or volume of coil transducer 39 becoming relatively large. The embodiment shown in FIGS. 1 and 2 also features an increased risk of internal high voltage breakdown between such full through vias and coils 23 and 24, especially if voids have formed between any of the various layers of coil transducer 39 during manufacturing, more about is said below.

Figure 3:
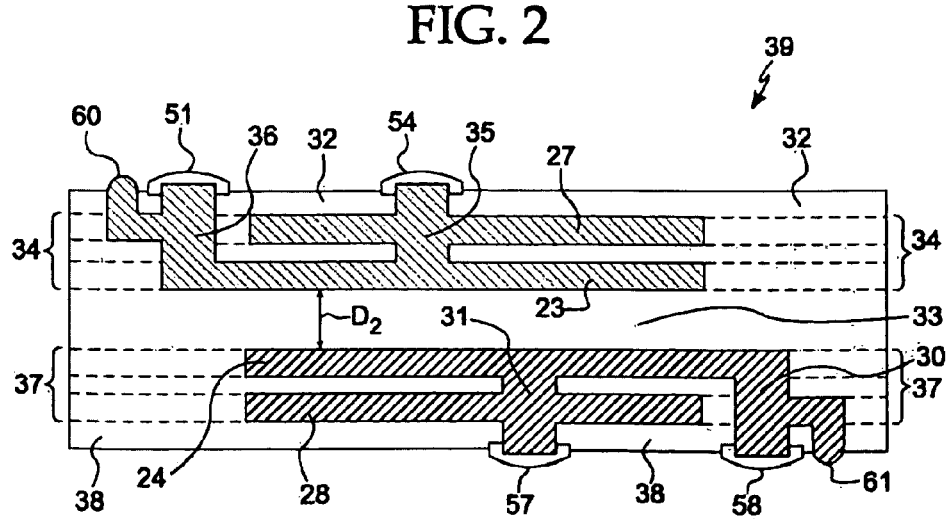
FIG. 3 illustrates another embodiment of coil transducer 39 of the invention.
Figure 4:
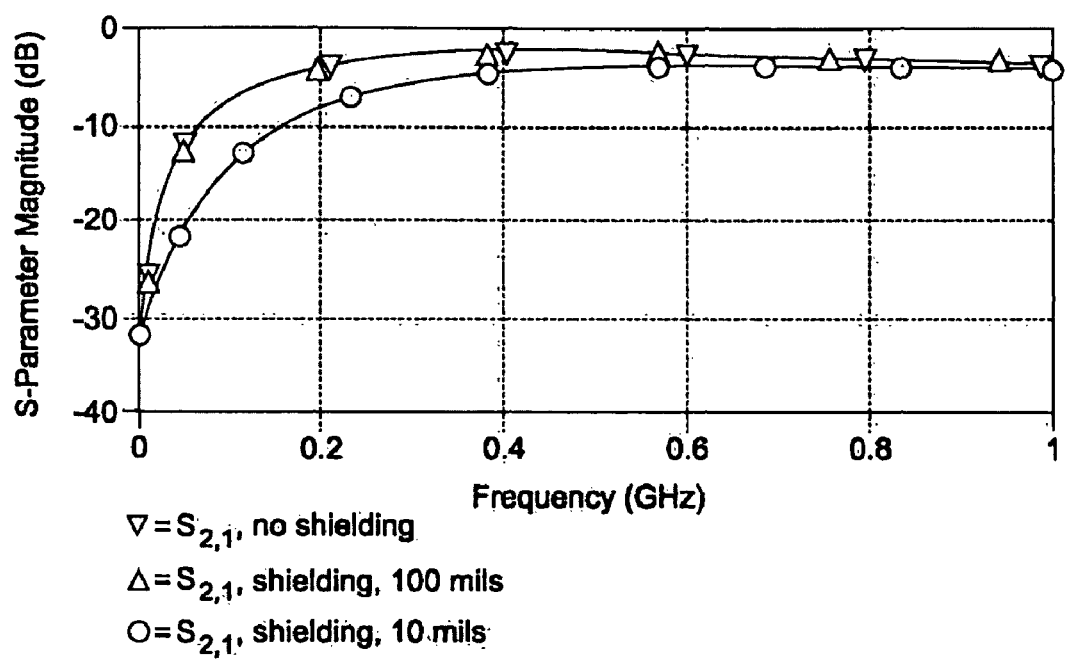
FIG. 4 shows comparative S-parameter modeling data for coil transducers isolators having different thicknesses of shielding.

Referring now to FIG. 3, there is shown a cross-sectional view of another embodiment of coil transducer 39 of the invention, where portions of vertical via 36 extending downwardly beyond the first metalized layer, and portions of vertical via 30 extending upwardly beyond the third metalized layer, have been eliminated therefrom. Such a configuration eliminates the potential high voltage breakdown problems arising from the horizontal proximities of via 36 to the third and fourth metalized layers, and via 30 to the second and first metalized layers (as shown in FIG. 2 and denoted by distances $D_1$). Instead, the embodiment illustrated in FIG. 3 features distance $D_2$ as the closet dimension between the various components of coil 23 on the one hand, and coil 24 on the other hand, which as described above are often at very different electrical potentials respecting one another. Thus, at least in respect of reducing the probability or possibility of arcing between various portions of coil 23 and coil 24, it will be appreciated that the embodiment illustrated in FIG. 3 provides improved performance compared to the embodiment shown in FIG. 2. Note further that the embodiment illustrated in FIG. 3 also eliminates major portions of vertical vias 30 and 36 in respect of the embodiment shown in FIG. 2.

As in the embodiment shown in FIG. 2, coating or coverlay material 32 and 38 is disposed over otherwise exposed coils 23 and 24. In addition, electrical connections to transmitter circuit 21 and receiver circuit 22 (not shown in FIG. 3) are established through wirebond pads 60 and 62 (see, for example, FIG. 1), and through wirebond pads 61 and an additional wirebond pad (not shown in FIG. 3), and which are located on opposing respective top and bottom sides of coil transducer 39. In such a wirebond pad configuration, conductive vias 36 and 30 need only penetrate two metalized layers so that, for example, electrical signals need only be routed from wirebond pad 62 to spiral conductor 27, then through via 35 to coil 23, and then up through via 36 to wirebond pad 60. Similarly, electrical signals need only be routed between the third and fourth metalized layers and then to wirebond pad 61. Because lithographic alignment is much easier when blind or partial vias 36 and 30 of FIG. 3 are employed instead of full or through vias, metal landing pads 51, 54, 57 and 58 can be made smaller. As a result, vias 36 and 30 do not consume as much real estate or volume in coil transducer 39 of FIG. 3 as in the embodiments illustrated in FIGS. 1 and 2, which in turn permits coil transducer 39 to be made smaller. Because no penetrations of substrate 33 are required to accommodate full or through vias in the embodiment shown in FIG. 3, internal high voltage breakdown performance is improved in the embodiment shown in FIG. 3 respecting the embodiment of FIGS. 1 and 2. On the other hand, during manufacturing the embodiment of FIG. 3 must be turned over to complete wirebonding, while all wirebonding can be carried out in the embodiment of FIGS. 1 and 2 without turning over coil transducer 39.

Figure 5:
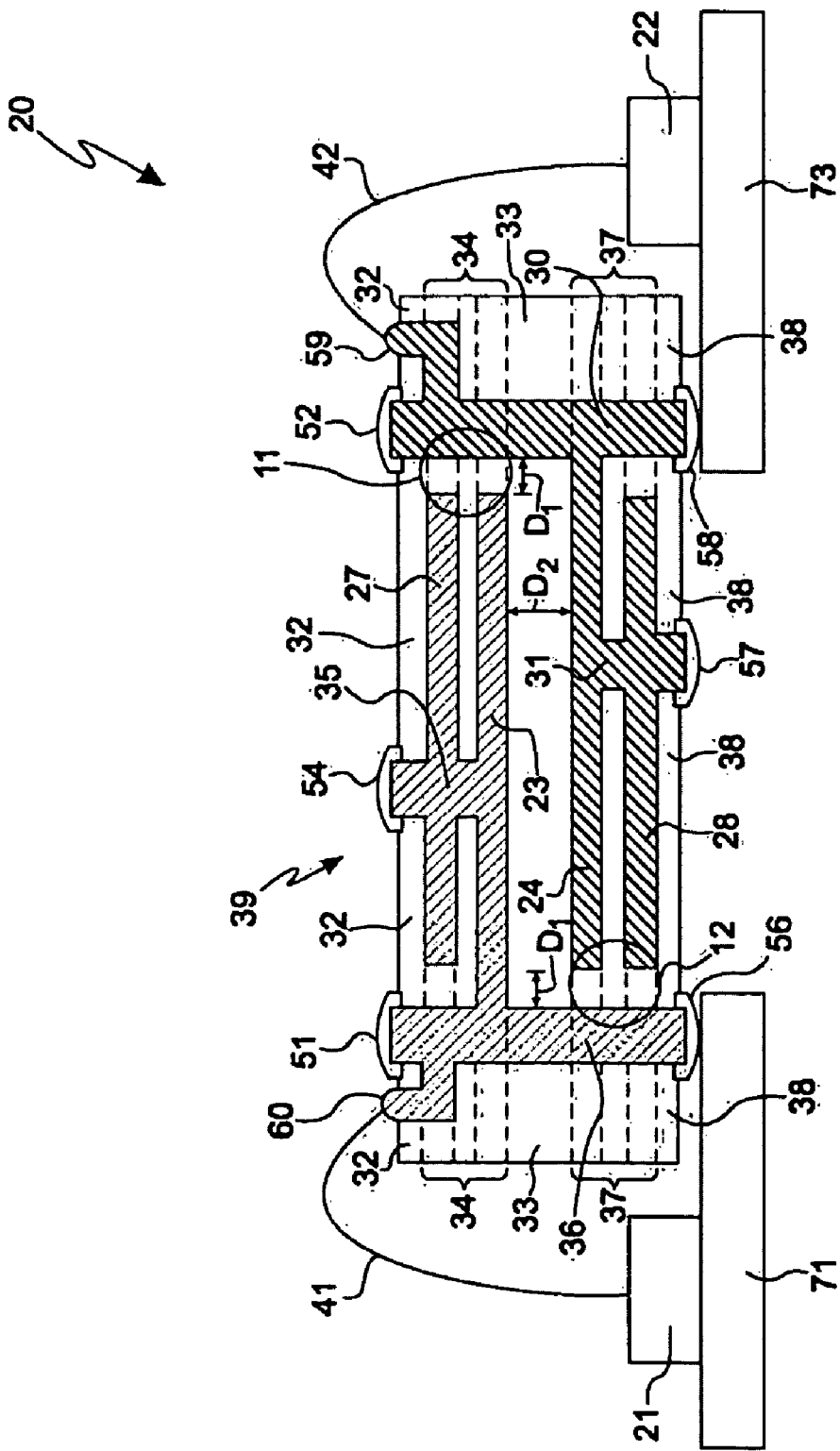
FIG. 5 illustrates one embodiment of coil transducer 39 and galvanic isolator 20 of the invention.

Another consideration in packaging is whether to provide one or more metal shield planes. A metal shield plane can help reduce undesired outside electromagnetic interference from interfering with the operation of coil transducer 39 or galvanic isolator 20. If such a metal shield plane is located too close to coils 23 or 24, however, the metal shield plane may attenuate the magnetic fields generated by coil transducer 39. FIG. 5 shows electromagnetic modeling results generated using software from Computer Simulation Technology™ ("CST") for a galvanic isolator having a metal shield plane located about 10 mils from a coil transducer (circles), about 100 mils from a coil transducer (triangles), and with no metal shield (upside-down triangles). As shown in FIG. 5, $S_{21}$ signal through-parameter performance degrades substantially when a metal shield plane is brought too close to a coil transducer (e.g., a separation of only 10 mils). Related modeling work indicates that a 50 mil thickness of silicone or other suitable electrically insulating material or molding compound may also function as an effective shield, even when no metal is disposed therein. Because high throughput is desired for both signal and power applications, locating any metal—even a metal shield plane held at approximately the same potential as nearby coils 23 or 24—over or near such coils at a separation distance of 50 mils or less may degrade throughput performance top an unacceptable degree.

To avoid high voltage breakdown through the coating or coverlay layers 32 and 38, it is preferred not to place coil 23 and coil 24 of coil transducer 39 such that they are located directly over (in respect of a vertical direction) a metal lead frame, which is typically at a very different potential. For example, at any given time transmitter circuit 21 might be running at a potential 5 kV different from receiver circuit 22. Thus, if the first and second metalized layers are used to form input coil 23 and the third and fourth metalized layers are used to form output coil 24, then an input lead frame for galvanic isolator 20 which is at a similar potential to coil 23 should not extend directly beneath coil 24.

Accordingly, galvanic isolator 20 is preferably configured such that input lead frame 71 extends beneath input wirebond pads to facilitate wirebonding and provide firm structural support thereunder, but terminates before extending directly beneath coil 24. Similarly, output lead frame 73 preferably extends beneath output wirebond pads to facilitate wirebonding and provide firm structural support thereunder, but terminates before extending directly beneath either via 30 or the via under 53. A cross-sectional view of one embodiment of galvanic isolator 20 satisfying such design criteria is shown in FIG. 5. In the embodiment shown in FIG. 5, wirebond pads 59 and 60 are located on the top surface of coil transducer 39, and are operably connected to transmitter IC 21 through wirebonds 41, and receiver IC 22 through wirebonds 42, respectively. In such a configuration, and as in the embodiment shown in FIGS. 1 and 2, access to the third and fourth metalized layers is provided from the top surface of coil transducer 39 by conductive vias 30. 36 and a via disposed beneath location 53 (see FIG. 1).

Figure 6:
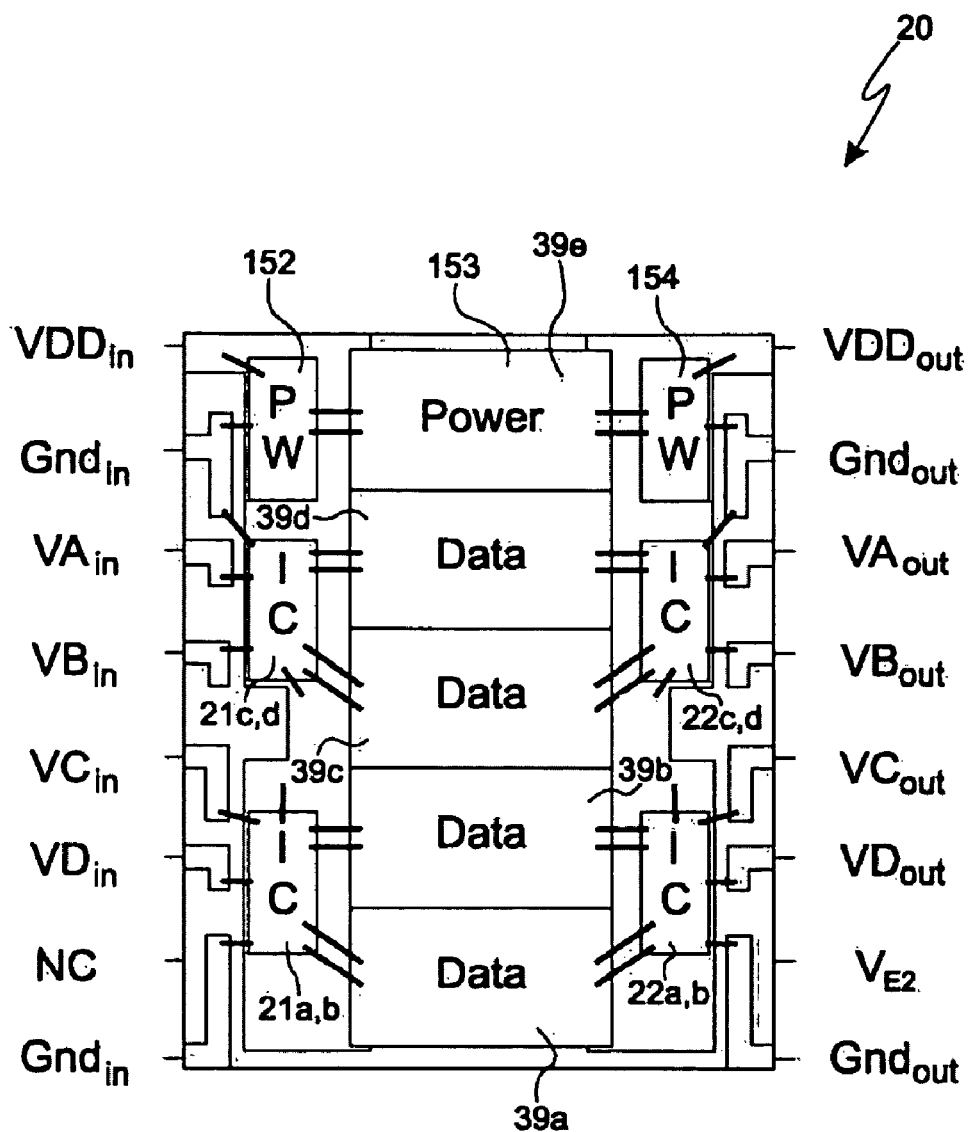
FIG. 6 illustrates another embodiment of galvanic isolator 20 and coil transducers 39a-39e of the invention.

A top view of another embodiment of galvanic isolator 20 comprising a plurality of coil transducers 39*a*-39*e* satisfying the design criteria discussed hereinabove is shown in FIG. 6.

Yet another consideration in galvanic isolator packaging is where busbars should be located so that a bias voltage may be provided to wirebond pads during electroplating, thereby to facilitate the establishment of reliable wirebonded connections. The busbars must reach to the edges of coil transducer 39 so that a bias voltage may be applied during an electroplating process. In one embodiment, a first busbar is operably connected to first coil 23, while a second busbar is operably connected to second coil 24. If a busbar end is located directly over a lead frame operating at a significantly different electrical potential than the busbar, an external high voltage breakdown can occur along the edge of coil transducer 39 between the end of the busbar and the lead frame. External high voltage breakdowns can also occur between busbar ends that are located too close to one another, especially since the process used to separate coil transducer die from one another can smear the metal along the cut sides of the coil transducers. Busbars and busbar ends are therefore preferably spaced far enough apart that external high voltage breakdowns cannot occur between them, and not directly above or below a lead frame at a significantly different potential. In one embodiment, a first busbar for coil 23 is located relatively close to an input lead frame, while a second busbar for coil 24 is located relatively close to an output lead frame. In preferred embodiments of the invention, busbars or portions of busbars are separated from one another, as well as from lead frames, by at least about 75 mils.

Referring now to FIGS. 7(*a*) and 7(*b*), there is shown an embodiment of galvanic isolator 20 where wirebond connections to the input and output sides of coil transducer 39 are disposed on opposing sides thereof. FIGS. 7(*a*) and 7(*b*) show cross-sectional views of galvanic isolator 20 in different stages of package assembly. In FIG. 7(*a*), transmitter circuit 21 is attached to input lead frame 71 by, for example, electrically non-conductive epoxy, and then operably connected to the input side of coil transducer 39 through wirebond 41 and wirebond pad 60. Next, isolator 20 is flipped over and receiver circuit 22 is attached to output lead frame 73 by, for example, electrically non-conductive epoxy, and then operably connected to the output side of coil transducer 39 through wirebond 42 and wirebond pad 61 (see FIG. 7(*b*)). As discussed above in respect of FIG. 3, the configuration of galvanic isolator 20 shown in FIGS. 7(*a*) and 7(*b*) eliminates the potential high voltage breakdown problems arising from the horizontal proximities of via 36 to the third and fourth metalized layers, and of via 30 to the second and first metalized layers shown in FIG. 2 and denoted by distances $D_1$. Instead, the embodiment illustrated in FIGS. 7(*a*) and 7(*b*) features increased distance $D_2$ as the closet dimension between the various components of coil 23 on the one hand, and coil 24 on the other hand, which as described above are often operating at very different electrical potentials respecting one another. Moreover, galvanic isolator 20 of FIGS. 7(*a*) and 7(*b*) features input lead frame 71 and output lead frame 73 positioned in respect of galvanic isolator 20 such that structural support is provided thereto by lead frames 71 and 73. This reduces the probability or possibility of external arcing because lead frames 71 and 73 do not extend beneath isolator 20 or coil transducer 39 sufficiently far so as to be located directly beneath coils 23 or 24.

Once coil transducer 39 has been attached to lead frames 71 and 73 and wirebonds have operably attached transmitter circuit 21 and receiver 22 thereto, isolator 20 is preferably potted in a dielectric potting material that inhibits or prevents the occurrence of external high voltage breakdown (not shown in the Figures). This dielectric material should wet or adhere to the surfaces of coil transducer 39, lead frames 71 and 73, and ICs 21 and 22 such that no or few voids form or are included in the potting material after it has cured or dried. The dielectric potting material preferably exhibits high voltage hold-off and low dielectric loss performance characteristics so that the magnetic fields generated by isolator 20 are not attenuated. The dielectric potting material should also have a coefficient of thermal expansion similar to that of coil transducer 39 so that excessive stress is not placed on layers disposed within coil transducer 39; otherwise, spiral conductors 23, 27, 24 or 28 may break or fracture. In another embodiment, a first dielectric potting material may be placed around various or all portions of isolator 20, followed by placing a second dielectric potting material around the first dielectric potting material, the second dielectric potting material forming an external surface of isolator 20. Examples of suitable dielectric potting materials include silicone, electrically non-conductive epoxy, polyimide, glass-filled epoxy and glass- and carbon-filled epoxy.

In another embodiment, galvanic isolator 20 is overmolded. In one embodiment, lead frame 71 with transmitter integrated circuit 21, and coil transducer 39 attached thereto, and lead frame 73 with receiver integrated circuit 22 and coil transducer 39 attached thereto, are wirebonded, placed in a mold, and a melted appropriate electrically insulating molding material such as glass-filled epoxy is forced into the mold to encapsulate at least portions of the package. The molding material is then allowed to cool and harden, thereby providing electrical insulation and imparting substantial additional structural rigidity to the resulting package. The molding material preferably has an appropriate dielectric constant and low dielectric loss such that the electrical performance of galvanic isolator 20 is not degraded. The leads are then trimmed and bent.

Any one or more of the first, second, third, and fourth metalized layers, and vias 30, 31, 35 and 36 may be formed of one or more of gold, silver, copper, tungsten, nickel, tin, aluminum, aluminum-copper, and alloys, combinations or mixtures thereof.

In addition, in one embodiment coil transducer 39 may be mounted on a printed circuit board or a flex circuit substrate instead of being mounted on one or more lead frames. Thus, the packaging examples described and shown herein are not meant to cover all possibilities for packaging coil transducer 39 of the invention, and many different variations and permutations are contemplated.

Note that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A coil transducer, comprising:
    a generally planar electrically insulating substrate comprising opposing first upper and first lower surfaces, the substrate forming a dielectric barrier and comprising an electrically insulating, non-metallic, non-semiconductor, low dielectric loss material, the substrate having no ferrite, magnetic, ferromagnetic, or electroconductive core, or core material, disposed therewithin or thereon;
    a first electrically conductive coil comprising at least a first metalized layer located above the first upper surface of the substrate;
    a second electrically conductive coil comprising at least a third metalized layer located beneath the first lower surface of the substrate;
    at least a first metalized via electrically connected to the first coil and extending to or near a second upper surface of the coil transducer for electrical connection to a first contact disposed thereon or therein, and at least a second metalized via electrically connected to the second coil and extending to or near a second lower surface of the coil transducer for electrical connection to a second contact disposed thereon or therein;

wherein the first and second coils are not connected electrically to one another and are spatially arranged and configured respecting one another such that at least one of power and data signals may be transmitted by the first coil to the second coil vertically across the substrate, the first coil is separated from the second coil by a vertical distance exceeding about $1/1,000^{th}$ of an inch (1 mil), and a breakdown voltage between the first coil and the second coil exceeds about 1,000 volts RMS.

2. The coil transducer of claim 1, further comprising an electrical conductor formed in a second metalized layer disposed within, upon or near the substrate, the electrical conductor and second layer being disposed above the first coil and the first metalized layer, the first coil and the electrical conductor being electrically connected to one another and to the first via.

3. The coil transducer of claim 1, further comprising an electrical conductor formed in a fourth metalized layer disposed within, upon or near the substrate, the electrical conductor and fourth layer being disposed below the second coil and the third metalized layer, the electrical conductor and the second coil being electrically connected to one another and to the second via.

4. The coil transducer of claim 1, wherein the substrate is configured to impart substantial structural rigidity and strength to the coil transducer.

5. The coil transducer of claim 1, wherein the substrate material further comprises at least one of fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, and plastic.

6. The coil transducer of claim 1, wherein the coil transducer comprises a plurality of layers in addition to the substrate, at least one of the layers comprising the low dielectric loss material.

7. The coil transducer of claim 1, wherein the breakdown voltage between the first coil and the second coil exceeds about 2,000 volts RMS when applied over a time period of about one minute, exceeds about 2,000 volts RMS when applied over a time period of about six minutes, or exceeds about 2,000 volts RMS when applied over a time period of 24 hours.

8. The coil transducer of claim 1, wherein the breakdown voltage between the first coil and the second coil exceeds about 5,000 volts RMS when applied over a time period of about one minute, exceeds about 5,000 volts RMS when applied over a time period of about six minutes, or exceeds about 5,000 volts RMS when applied over a time period of 24 hours.

9. The coil transducer of claim 1, wherein at least one of the coil transducer and the substrate has a thickness between upper and lower surfaces thereof ranging between about 0.5 mils and about 25 mils, between about 1 mil and about 25 mils, or between about 1.5 mils and about 25 mils.

10. The coil transducer of claim 1, further comprising at least one of an input lead frame and an output lead frame connected to the coil transducer such that electrically conductive portions of the first and second lead frames do not extend beneath the substrate to locations directly beneath the first or second coils.

11. The coil transducer of claim 1, further comprising an input lead frame and an output lead frame connected to the coil transducer such that the input lead frame is mechanically connected to a lower surface of the coil transducer and the output lead frame is mechanically connected to an upper surface of the coil transducer.

12. The coil transducer of claim 1, further comprising an input lead frame and an output lead frame connected to the coil transducer, and a moldable electrically insulating material encapsulating at least portions of the coil transducer and the input and output lead frames.

13. The coil transducer of claim 1, wherein the coil transducer isolator is configured to operate as one of a data transfer device and a power transfer device.

14. The coil transducer of claim 1, wherein the first coil is operably connected to a transmitter circuit and the second coil is operably connected to a receiver circuit.

15. The coil transducer of claim 1, wherein at least one of the first metalized layer and the second metalized layer comprises at least one of gold, nickel, silver, copper, tungsten, tin, aluminum, and aluminum-copper.

16. The coil transducer of claim 1, wherein the coil transducer is fabricated on one of a printed circuit board and a flex circuit substrate.

17. A coil transducer, comprising:
a generally planar electrically insulating substrate comprising opposing first upper and first lower surfaces, the substrate forming a dielectric barrier and comprising an electrically insulating, non-metallic, non-semiconductor low-dielectric-loss material having a dielectric loss tangent at room temperature that is less than or equal to 0.05, the substrate having no ferrite, magnetic, ferromagnetic, or electroconductive core, or core material, disposed therewithin or thereon;
a first electrically conductive coil comprising at least a first metalized layer located above the first upper surface of the substrate;
a second electrically conductive coil comprising at least a third metalized layer located beneath the first lower surface of the substrate;
at least a first metalized via electrically connected to the first coil and extending to or near a second upper surface of the coil transducer for electrical connection to a first contact disposed thereon or therein, and
at least a second metalized via electrically connected to the second coil and extending to or near a second lower surface of the coil transducer for electrical connection to a second contact disposed thereon or therein;
wherein the first and second coils are not connected electrically to one another and are spatially arranged and configured respecting one another such that at least one of power and data signals may be transmitted by the first coil to the second coil vertically across the substrate, the first metalized layer is separated from the third metalized layer by a vertical distance exceeding about $1/1,000^{th}$ of an inch (1 mil), and a breakdown voltage between the first coil and the second coil exceeds about 1,000 volts RMS.

18. The coil transducer of claim 17, further comprising an electrical conductor formed in a second metalized layer disposed within, upon or near the substrate, the electrical conductor and the second layer being disposed above the first coil and the first metalized layer, the first coil and the electrical conductor being electrically connected to one another and to the first via.

19. The coil transducer of claim 17, further comprising an electrical conductor formed in a fourth metalized layer disposed within, upon or near the substrate, the electrical conductor and fourth layer being disposed below the second coil and the third metalized layer, the second coil and the electrical conductor being electrically connected to one another and to the second via.

20. The coil transducer of claim 17, wherein the substrate is configured to impart substantial structural rigidity and strength to the coil transducer.

21. The coil transducer of claim 17, wherein the substrate material further comprises a material selected from the group consisting of one or more of fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, and plastic.

22. The coil transducer of claim 17, wherein the coil transducer comprises a plurality of layers in addition to the substrate, at least one of the layers comprising the low dielectric loss material.

23. The coil transducer of claim 17, wherein the breakdown voltage between the first coil and the second coil exceeds about 2,000 volts RMS when applied over a time period of about one minute, exceeds about 2,000 volts RMS when applied over a time period of about six minutes, or exceeds about 2,000 volts RMS when applied over a time period of 24 hours.

24. The coil transducer of claim 17, wherein the breakdown voltage between the first coil and the second coil exceeds about 5,000 volts RMS when applied over a time period of about one minute, exceeds about 5,000 volts RMS when applied over a time period of about six minutes, or exceeds about 5,000 volts RMS when applied over a time period of 24 hours.

25. The coil transducer of claim 17, wherein at least one of the coil transducer and the substrate has a thickness between upper and lower surfaces thereof ranging between about 0.5 mils and about 25 mils, between about 1 mil and about 25 mils, or between about 1.5 mils and about 25 mils.

26. The coil transducer of claim 17, further comprising at least one of an input lead frame and an output lead frame connected to the coil transducer such that electrically conductive portions of the first or second lead frames do not extend beneath the substrate to locations directly beneath the first or second coils.

27. The coil transducer of claim 17, further comprising an input lead frame and an output lead frame connected to the coil transducer such that the input and output lead frames are both mechanically connected to a lower surface of the coil transducer.

28. The coil transducer of claim 17, wherein the coil transducer is configured to operate as one of a data transfer device and a power transfer device.

29. The coil transducer of claim 17, wherein the first coil is operably connected to a transmitter circuit and the second coil is operably connected to a receiver circuit.

30. The coil transducer of claim 17, wherein at least one of the first metalized layer, the second metalized layer, the first via, and the second via comprises at least one of gold, nickel silver, copper, tungsten, tin, aluminum, and aluminum-copper.

31. The coil transducer of claim 17, wherein the coil transducer is fabricated on one of a printed circuit board and a flex circuit substrate.

* * * * *